United States Patent [19]

Selim

[11] Patent Number: 4,636,747
[45] Date of Patent: Jan. 13, 1987

[54] SYSTEM AND METHOD FOR WIDEBAND, CONTINUOUS TUNING OF AN OSCILLATOR

[75] Inventor: Harold N. Selim, Wichita, Kans.

[73] Assignee: IFR, Inc., Wichita, Kans.

[21] Appl. No.: 710,309

[22] Filed: Mar. 11, 1985

[51] Int. Cl.⁴ .............................................. H03L 7/02
[52] U.S. Cl. .................................... 331/1 R; 331/16; 331/36 C; 331/177 V
[58] Field of Search ....................... 331/1 R, 9, 16, 34, 331/36 L, 177 R, 177 V; 332/19, 30 V; 455/260

[56] References Cited

U.S. PATENT DOCUMENTS

| | | | |
|---|---|---|---|
| 3,614,649 | 10/1971 | Gerig ........................................ | 331/17 |
| 3,855,548 | 12/1974 | Nandi et al. ............................. | 331/107 A |
| 3,936,765 | 2/1976 | Lewis et al. ............................. | 331/1 R |
| 4,070,635 | 1/1978 | Healey, III ............................... | 331/19 |
| 4,078,210 | 3/1978 | Lewis ....................................... | 331/107 A |
| 4,336,505 | 6/1982 | Meyer ...................................... | 331/1 R |
| 4,358,741 | 11/1982 | Nardin ..................................... | 331/2 |
| 4,463,321 | 7/1984 | Horner ..................................... | 331/1 R |

Primary Examiner—Siegfried H. Grimm
Attorney, Agent, or Firm—Woodard, Weikart, Emhardt & Naughton

[57] ABSTRACT

A system and method for continuous tuning of a YIG oscillator over its entire operating range by control of a resolver in a feedback loop around the oscillator. The resolver and a delay line form a phase shift network the output of which is compared in phase with the output of the oscillator, which is also coupled to the input of the resolver, and the phase-difference signal resulting from the phase comparison is coupled to an integrator connected in turn to the tuning signal input of the oscillator. Repetitive operation of the resolver over its operating range enables continuous tuning of the oscillator over its entire operating range.

16 Claims, 3 Drawing Figures

SYSTEM AND METHOD FOR WIDEBAND, CONTINUOUS TUNING OF AN OSCILLATOR

BACKGROUND OF THE INVENTION

This invention relates to tunable oscillators, and particularly to wideband, electrically tunable oscillators.

Electrically tunable oscillators are widely used in electronic equipment, including communications, test and instrumentation equipment. It is often desirable in the use of such equipment to closely examine a particular band of frequencies, for example, to look for spurious signals generated in a particular frequency range by a piece of RF equipment. Such an examination typically entails gradually varying the tuned frequency of, for example, a spectrum analyzer, to cover the entire band of interest. As the tuned frequency crosses from one frequency range of the instrument to another, discontinuities, or frequency jumps, commonly occur which make it difficult to track a signal of interest.

U.S. Pat. No. 4,336,505 to Meyer discloses a controlled frequency signal source apparatus including a feedback path around a VCO for the reduction of VCO phase noise in which the feedback network includes a time delay network connected to one input port of a phase detector, with the VCO output signal being supplied to the time delay network and the second input port of the phase detector. The time delay network includes a time delay and a variable phase shifter. The feedback network supplies a negative feedback signal proportional to the internally generated phase noise of the VCO to the VCO frequency control terminal.

The purpose of the Meyer feedback loop is to reduce phase noise without substantially altering the VCO tuning characteristics. In every disclosed embodiment, Meyer has a primary frequency control for the VCO other than the control provided by the feedback network. Meyer discloses a conventional phase-locked loop, including a divide-by-N counter, a frequency/phase detector, an integrator and a loop filter, for control of the VCO output frequency. In FIG. 9, Meyer discloses the use of digitally encoded frequency information to control both the frequency of the VCO and the time delay of the time delay network. As an alternative embodiment to that shown in FIG. 8, Meyer describes the use of the VCO frequency control signal which is supplied to the divide-by-N counter 62 as a signal which can be processed and supplied to digital phase shifter 80 to cause that phase shifter to supply the appropriate amount of phase shift to keep variable phase shifter 32 in its operating range. Thus, Meyer teaches the use of a feedback network employing a time delay network for reduction of phase noise but not for control of oscillator output frequency. A separate, conventional phase-locked loop is employed in conjunction with the feedback network described above for control of the VCO frequency.

U.S. Pat. No. 3,614,649 to Gerig discloses a VCO with a varactor phase shifter and a delay line connected in series with the output of the oscillator. In a fine tuning mode, a phase discriminator measures the phase difference between the output of the delay line and the output of the VCO and feeds back a difference signal through a conditioning amplifier to the input of the VCO to dynamically stabilize the oscillator frequency. When the VCO is stabilized at one of the positive-going X-axis crossings of the discriminator response characteristic, the VCO output frequency can be fine tuned over a range of 14 KHz by varying the control input voltage to the varactor phase shifter from −5 volts to +5 volts causing the phase shifter to produce a 360° variation in phase shift. Gerig does not describe continuous tuning from one X-axis crossing to the next under control of the varactor phase shifter; instead, for wideband tuning, the loop is opened and the VCO is slewed in frequency.

Smooth, closed-loop tuning over multiple 14 KHz ranges is not possible with the Gerig system since a full-scale swing in the control voltage of the varactor phase shifter would be required each time a range limit of the phase shifter was reached. The full-scale voltage swing would result in a perceptible jump in frequency at each 360° crossover due to voltage source limitations, such as the inability to make a large voltage change sufficiently rapidly and precisely. Such discontinuities could cause an instrument operator to lose track of a signal of interest, for example, a spurious signal generated by an RF device under test on a spectrum analyzer. A truly continuous tuning system, i.e., one capable of precise tuning over a wide range without discontinuities such as those just described, would provide a significant benefit to operators of test and instrumentation equipment such as spectrum analyzers and signal generators.

A digital phase shifter employing a read-only memory for phase angle data coupled to two multiplying D/A converters is disclosed in D. Sheingold (Ed.), *Analog-Digital Conversion Handbook*, Analog Devices, Inc., 1972, p. 1–66. The description of the phase shifter does not include any reference to oscillator applications.

A number of other circuit arrangements have been designed in attempts to provide improvements in oscillators and related circuits, as illustrated by the following patents.

Lewis et al., in U.S. Pat. No. 3,936,765, discloses a surface acoustic wave oscillator comprising a surface acoustic wave delay line and an amplifier. An object of the Lewis et al. invention is to eliminate the effect of any temperature-dependent phase shift through the amplifying circuit so that the frequency of oscillation is determined by the delay line alone. The oscillator network includes a phase-sensitive detector and a variable phase shift network.

U.S. Pat. No. 4,070,635 to Healey discloses a delay line oscillator with a phase-locked loop for reducing phase fluctuations. The oscillator includes a delay line connected in series with the voltage controlled phase modulator.

U.S. Pat. No. 4,078,210 to Lewis discloses a multimoded acoustic wave oscillator comprising a SAW delay line and a rotary switch in the feedback loop of an amplifier. Rotation of the wiper of the rotary switch changes the frequency of oscillation.

Ultrahigh frequency single mode oscillation controlled by a circuit acoustic wave crystal is described in U.S. Pat. No. 3,855,548 to Nandi et al. A surface acoustic wave device connected in a feedback path around an amplifier is the primary frequency control component of the oscillator. The feedback path includes a phase adjusting network for making small adjustments in the frequency of oscillation of the oscillator.

U.S. Pat. No. 4,358,741 to Nardin discloses a micro time and phase stepper which uses a programmable delay generator to provide selected time delays in the output signal of an oscillator.

SUMMARY OF THE INVENTION

The present invention provides a system and method for continuous tuning of an electrically tunable oscillator over its entire operating range by control of a variable phase shift network in a feedback loop around the oscillator. A mechanically or electrically operated phase shifter and a delay line form a phase shift network the output of which is compared in phase with the output of the oscillator, which is also coupled to the input of the phase shift network, and the phase-difference signal resulting from the phase comparison is coupled to an integrator connected in turn to the tuning signal input of the oscillator. Continuous, repetitive operation of the phase shifter over its operating range enables continuous, high-resolution tuning of the oscillator over its entire operating range without discontinuities or loss of phase lock.

A general object of the invention is to provide an improved system and method for tuning an oscillator.

Another object of the invention is to provide an oscillator capable of continuous fine tuning over a wide operating range.

Another object is to provide continuous oscillator tuning and reduction of oscillator phase noise with a single phase-locked loop.

Other objects and advantages of the present invention will be apparent from the following detailed description of the preferred embodiment taken with reference to the accompanying drawings.

DESCRIPTION OF THE PREFERRED EMBODIMENT

Figure 1:
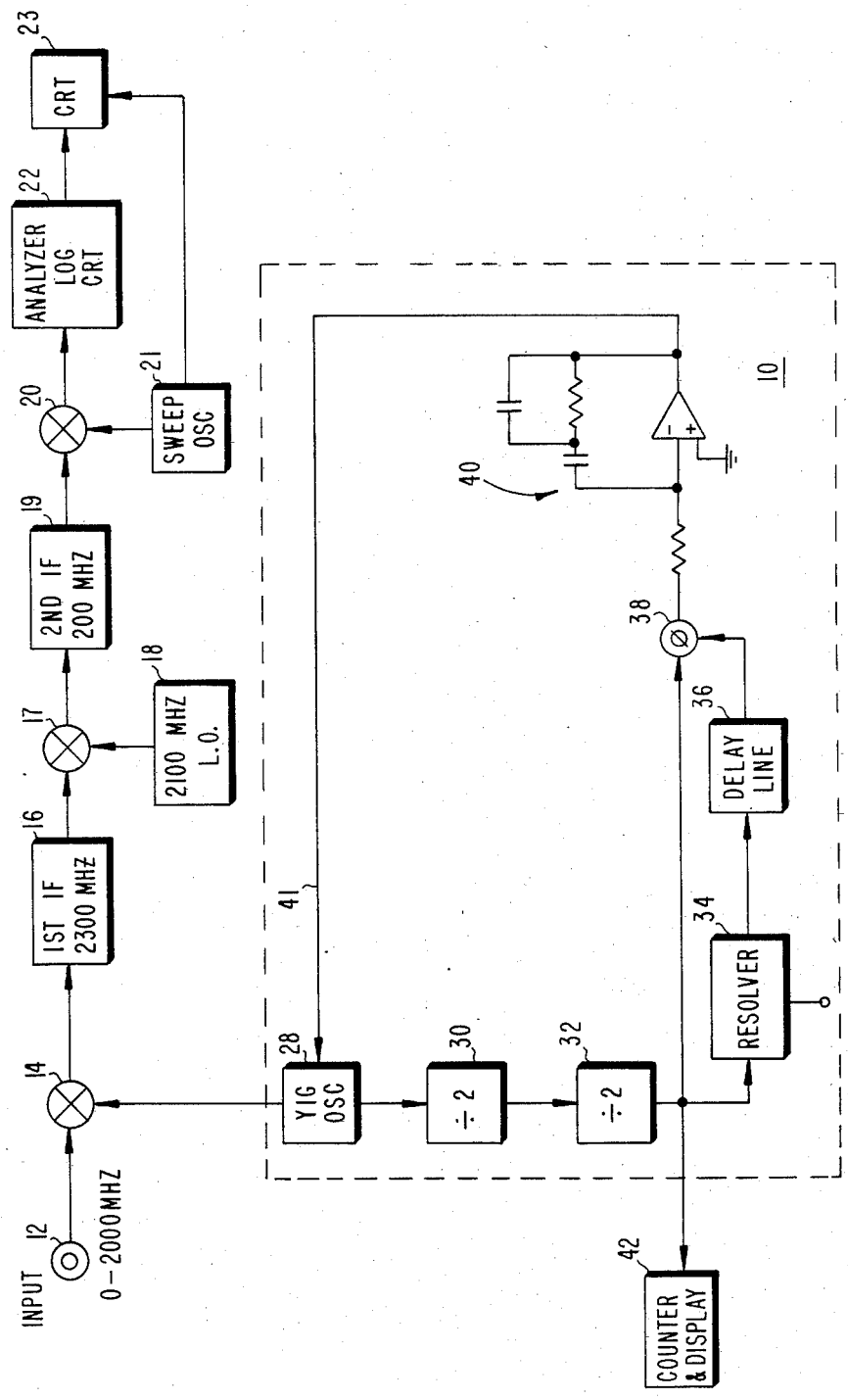
FIG. 1 is a block diagram of the preferred embodiment of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring to FIG. 1, the preferred embodiment of the present invention, designated by reference numeral 10, is illustrated in block diagram form in a spectrum analyzer. It will be understood that the present invention may be employed in other instruments or equipment, such as signal generators, and the application illustrated by FIG. 1 is merely exemplary. Tuning system 10 serves as the first local oscillator for the spectrum analyzer depicted in FIG. 1, which as shown, includes a superheterodyne receiver portion connected to input 12 and consisting of first mixer 14, tuning system 10, first IF amplifier 16, second mixer 17, second local oscillator 18 and second IF amplifier 19. The spectrum analyzer depicted in FIG. 1 is capable of analyzing signals at input 12 in the frequency range of 0–2000 MHz. Mixers 14 and 17, IF amplifiers 16 and 19 and second local oscillator 18 are conventional circuits and are accordingly not discussed in detail herein. Their function may be described briefly as follows: First IF amplifier 16 is a bandpass amplifier tuned to 2300 MHz, the first IF frequency, so as to pass a desired frequency which is selected by operation of tuning system 10 in a manner to be described.

As will be described, tuning system 10 is capable of supplying a first local oscillator output signal to mixer 14 in the range of 2300–4300 MHz, a 2000 MHz range which defines the input signal frequency range. With the first local oscillator frequency at a particular frequency, say 3300 MHz, the output frequency range of mixer 14 is 1300–3300 MHz, as well as other high-order components, for the indicated input frequency range. First IF amplifier 16 passes any output signal for mixer 14 at 2300 MHz, and substantially rejects all other frequency components. In like fashion, the output signal from IF amplifier 16 is converted down to 200 MHz through mixer 17, second local oscillator 18, which operates at a fixed frequency of 2100 MHz, and a second IF amplifier 19, which is a bandpass amplifier tuned to the second IF frequency, 200 MHz.

The output signal from IF amplifier 19 is applied to a mixer 20 the other input of which is connected to a sweep oscillator 21, the mixer output being connected to analyzer log circuit 22. Analyzer log circuit 22 is a logarithmic amplifier which converts the incoming signal amplitude from mixer 20 to log-amplitude for display on cathode-ray tube (CRT) 23 in terms of decibels. Sweep oscillator 21 supplies a sweep signal to mixer 20 and to the horizontal amplifier of CRT 23 to create a swept spectrum display, which will be further described below.

Tuning system 10 is a resolver-tuned local oscillator circuit comprising a YIG oscillator 28 coupled in a feedback loop which includes two dividers 30 and 32, a resolver 34, a delay line 36, a phase detector 38 and an integrator 40, connected as shown in FIG. 1. YIG oscillator 28 is capable of generating output signals in the frequency range 2300–4300 MHz under control of a tuning signal supplied from integrator 40 on tuning signal line 41. Dividers 30 and 32 are divide-by-two dividers which together reduce the output frequency range of YIG oscillator 28 (2300–4300 MHz) by a factor of four, to a range of 575–1075 MHz. The oscillator output frequency is divided down to reduce the attenuation in the delay line and simplify the construction of the resolver circuitry. Also, in this frequency range, conventional counter circuitry may be employed in counter and display 42, which provides a display of the frequency to which the receiver is tuned. Dividers 30 and 32 are both regenerative dividers of the type shown and described in my co-pending application Ser. No. 664,556, filed Oct. 25, 1984, which application is hereby incorporated herein.

In the preferred embodiment YIG oscillator 28 is controlled by the closed loop just described for swept spectrum displays up to 10 MHz wide. Sweep oscillator 21 provides switch-selectable sweep window widths from 10 KHz to 10 MHz corresponding to frequency spans of from 1 KHz/div to 1 MHz/div in a 1-2-5 sequence. The sweep window is centered about the frequency to which the receiver is tuned. Wider frequency span/div settings are preferably available in the frequency analyzer, in 1-2-5 sequence up to 200 MHz/div (2000 MHz window); however, at these wider settings, YIG oscillator 28 is controlled open-loop by a sweep generator (not shown) capable of causing it to sweep frequency ranges of 20-2000 MHz.

Figure 2:
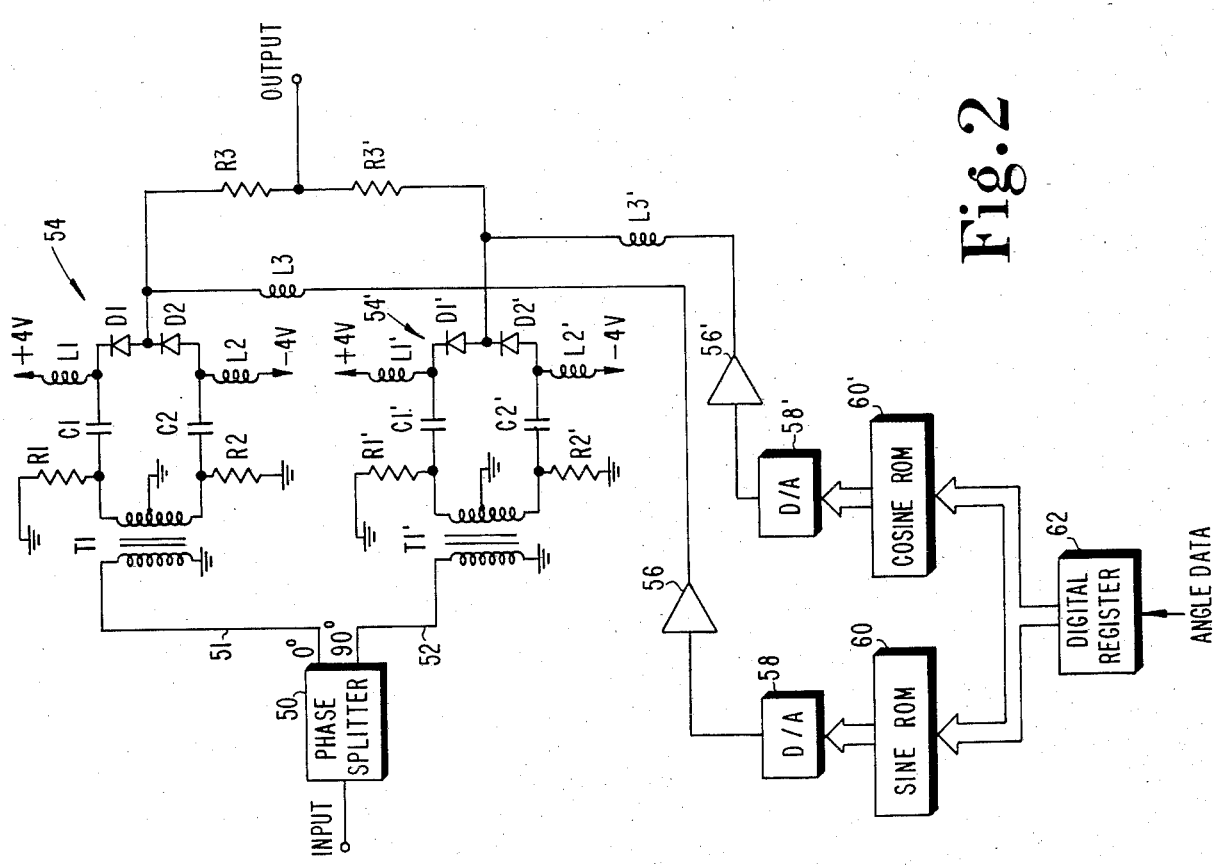
FIG. 2 is a schematic diagram of the resolver shown in FIG. 1.

During closed-loop operation the output frequency of YIG oscillator 28 is controlled by resolver 34, as will now be described. Resolver 34 is an electronic resolver which, when supplied with angle information in a manner which will be described, introduces a phase shift into the leg of the feedback loop consisting of resolver 34 and delay line 36. Resolver 34 is preferably an electronic resolver as depicted in FIG. 2; however, an electromechanical resolver may be alternatively employed. Phase detector 38 compares the phase of the signal received directly from divider 32 with that of the signal received through the leg described and generates a DC output signal of a level determined by the detected phase difference. Phase detector 38 is a conventional phase detector exhibiting a characteristic approximating that of an ideal multiplier, namely, $$V_{out} = K \sin(\phi_1 - \phi_2)$$

where $\phi_1$ and $\phi_2$ are the phase angles of the two input signals to the phase detector. Integrator 40 integrates the DC signal and supplies the integrated DC signal to the tuning signal input of oscillator 28 causing the oscillator to shift in frequency. Delay line 36 provides a phase leg linearly dependent on the frequency of the signal passing therethrough. As the output frequency of the signal from oscillator 28 varies, the phase lag of delay line 36 varies accordingly. The respective components of the feedback loop in tuning system 10 are arranged with polarities such that oscillator 28 will change in frequency in a direction to null out the error signal from phase detector 38. With this arrangement, when resolver 34 is adjusted to introduce an additional phase lead, that initial phase lead appears at the output of phase detector 38 as a corresponding DC level which, when integrated by integrator 40, causes oscillator 28 to increase in frequency. This increase in frequency causes delay line 36 to exhibit additional phase lag. The oscillator frequency increase continues until the phase lead introduced by resolver 34 is offset by the phase lag of delay line 36. A principal advantage of the present invention is that YIG oscillator 28 may be precisely and continuously tuned throughout its operating frequency range by adjusting the phase lead introduced by resolver 34.

Integrator 40 includes a feedback network consisting of a capacitor in series with a parallel resistor-capacitor circuit, as illustrated in FIG. 1. This integrator configuration allows the phase detector to both tune oscillator 28 and reduce the single-sideband phase noise of the oscillator. The present invention thus provides continuous oscillator tuning and reduction of phase noise with a single phase-locked loop around the oscillator.

Delay line 36 is constructed of approximately 82 feet of Teflon ® coaxial cable with a velocity factor of 0.67, resulting in an equivalent length of approximately 123 feet of air-velocity coax (Teflon is a registered trademark of E. I. Du Pont de Nemours & Co., Inc.). With this construction the delay line exhibits a delay line characteristic of 360° phase lag per 8 MHz frequency change. Delay line 36 may alternatively be a microstrip circuit of equivalent delay time.

Referring now to FIG. 2, resolver 34 is shown partially in schematic form and partially in block diagram form. The input to resolver 34, from divider 32 (FIG. 1), is supplied to a phase splitter 50, which is a wideband, 90° hybrid phase shifter capable of splitting an incoming signal into two signals and shifting one signal by 90° with a maximum error of ±5° through the 500 MHz output range of divider 32. A phase splitter having these specifications is commercially available from Anzac Division of Adams Russell, 80 Cambridge Stret, Burlington, Mass. 01803, as a custom circuit. Phase splitters of this type but for use in other frequency ranges of interest are available from a number of commercial sources. Thus, phase splitter 50 generates a 0° signal and a 90° signal on lines 51 and 52, respectively, which are in turn coupled respectively to bridge circuits 54 and 54'. Bridge circuit 54 consists of a center-tapped transformer T1 with one terminal of its primary grounded and with its secondary terminals connected to ground through resistors R1 and R2, respectively. The secondary of T1 is connected to two varactor diodes D1 and D2 through capacitor C1 and C2. The cathode of D1 is connected to a voltage supply of +4 volts DC through inductor L1, and the anode of D2 is connected to a supply of −4 volts DC through an inductor L2. Similarly, bridge circuit 54' consists of a center-tapped transformer T1' with one terminal of its primary grounded and with its secondary terminals connected to ground through resistors R1' and R2', respectively. The secondary of T1' is connected to two varactor diodes D1' and D2' through capacitor C1' and C2'. The cathode of D1' is connected to a voltage supply of +4 volts DC through inductor L1', and the anode of D2' is connected to a supply of −4 volts DC through an inductor L2'. The common point of diodes D1 and D2 is connected to the resolver output through resistor R3, and similarly, the common terminal of varactor diodes D1' and D2' is connected to the output through resistor R3'. R3 and R3' act as a summing network. All four varactor diodes preferably exhibit capacitance of 1.2 pf at −4 volts.

Resolver 34 introduces a phase shift of any desired amount in a 360° range by combining the 0° and 90° outputs of phase splitter 50 using bridge circuits 54 and 54' and the summing network R3 and R3'. Bridge circuit 54 is electronically adjusted by tuning varactors D1 and D2 to produce a desired combination of the 0° signal and its phase complement provided by center-tapped transformer T1. A bridge control voltage is applied to the two varactors through inductor L3 to control their comparative impedances and thereby balance the bridge or unbalance it by a desired amount. The balance state of the bridge determines the amplitude and phase of the resultant signal produced by bridge circuit 54, the phase being either 0° or 180°. Similarly, bridge circuit 54' is electronically adjusted by tuning varactors D1' and D2' to produce a desired combination of the 90° signal and its phase complement, the resultant signal pahse being 90° or 270° with amplitude determined by the comparative impedances of D1' and D2'. The impedances of D1' and D2' are controlled by a bridge control voltage applied to those varactors through inductor L3'. The two resultant signals just described are combined vectorially in the summing network R3 and R3' to produce an output signal which is shifted in phase with respect to the resolver input signal by any desired amount from 0° to 360°.

The phase shift of resolver 34 is determined by particular values of angle data corresponding to desired phase shifts and supplied to digital register 62. The angle value in register 62 at any one time is supplied to the address inputs of sine ROM 60 and cosine ROM 60' which contain a table of digital values representing the respective amplitudes of sine and cosine waves for a plurality of phase angles from 0° to 360°. The data lines of ROMs 60 and 60' are connected, respectively, to D/A converters 58 and 58', which convert the digital sine and cosine values appearing on the ROM data lines to analog sine and cosine values which are amplified by amplifiers 56 and 56' and coupled through inductors L3 and L3' to the two bridge circuits. Resolver 34 preferably has 16-bit resolution, which corresponds to phase resolution of less than 0.003°, although continuous tuning as intended to be comprehended herein is possible with somewhat lower resolution. Since 360° of phase shift corresponds to 8 MHz frequency change, as stated previously, the system resolution in terms of degrees is approximately 60 Hz.

The invention provides continuous, cumulative phase shifting over more than 360°, that is, there is no discontinuity, either in phase-shift, phase-shift control voltage or oscillator output frequency, when resolver 34 is adjusted through its entire 360° range and beyond. The two bridge control voltages vary only by small increments throughout the resolver range, as opposed to the full-scale control voltage swing of a conventional varactor phase shifter. For example, where the phase shift of resolver 34 has been incrementally adjusted to a point where resolver 34 exhibits 359° of phase lead and delay line 36 offsets that phase lead with a 359° phase lag, it is still possible to incrementally increase the phase lead in resolver 34, say, by 2°, and thereby cause the frequency of oscillator 28 to increase accordingly, without producing any discontinuity. In the circumstance just described, the incremental 2° phase lead results in an error signal output from phase detector 38 to which integrator 40 responds, causing the frequency of oscillator 28 to increase until the phase delay introduced by delay line 36 incrementally increases by 2° of phase lag. Continuous, repetitive adjustment of the resolver over its 360° range enables continuous tuning of the YIG oscillator over its entire operating range. With the delay line characteristic described above, i.e., 360° phase lag per 8 MHz frequency change, the YIG oscillator can be tuned from 2300-4300 MHz in 250 "revolutions" of the resolver.

Figure 3:
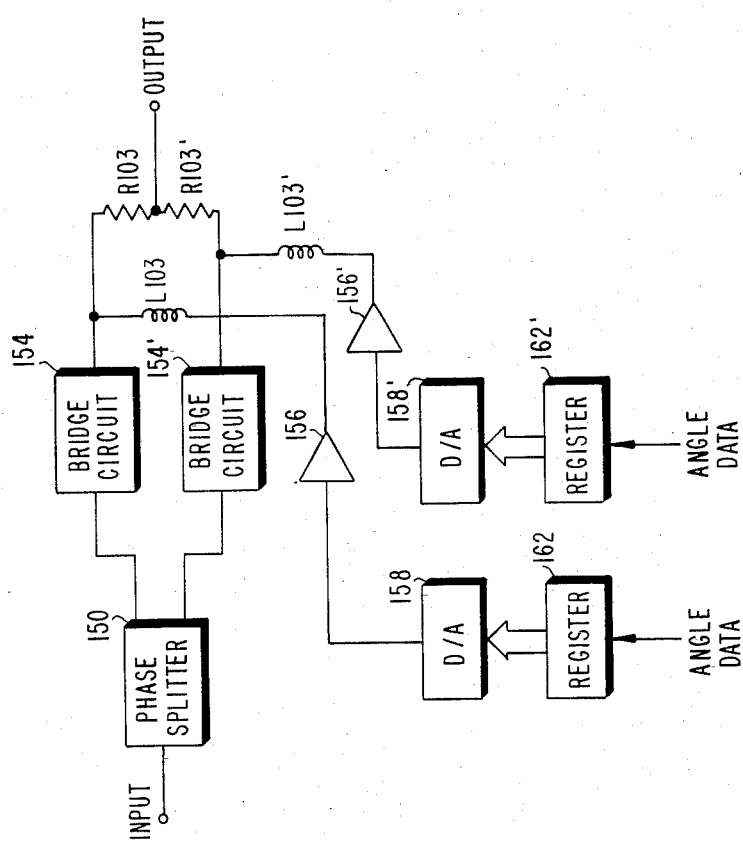
FIG. 3 is a block diagram of an alternative embodiment of the resolver shown in FIG. 1.

Resolver 34 may alternatively be embodied as shown in FIG. 3. The operation of the resolver shown in FIG. 3 is the same as that shown in FIG. 2, except as will be described, and accordingly the bridge circuits shown in detail in FIG. 2 are represented in block diagram form for ease of illustration. The input to resolver 34, from divider 32 (FIG. 1), is supplied to a phase splitter 150, which supplies 0° and 90° signals, respectively, to bridge circuits 154 and 154'. Bridge circuits 154 and 154' produce two resultant signals, in the manner described above for the resolver embodiment of FIG. 2, and the resultant signals are combined vectorially in the summing network R103 and R103' to produce an output signal which is shifted in phase with respect to the resolver input signal by any desired amount from 0° to 360°. The phase shift of resolver 34 is determined by angle data corresponding to a desired phase shift and supplied in this embodiment to two digital registers 162 and 162'. The values in the registers are supplied directly to respective D/A converters 158 and 158', which convert the digital values to analog which are amplified by amplifiers 156 led through inductors L103 and L 54 and 154'. In this embodimen ne and cosine waves are approximated by triangular waves offset from each other by 90°. Angle data representing individual values of the two triangular waves are separately applied to registers 162 and 162', and the values in those registers are correspondingly converted to analog. While the precision of this circuit is not as high as that of the embodiment described earlier, the elimination of ROMs makes the circuit simpler and less costly.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

I claim:

1. A system for continuous tuning of an oscillator over its entire operating range by control of a variable phase shift network in a feedback loop around the oscillator, said system providing high-resolution, wideband tuning without discontinuities or loss of phase lock, said system comprising:
    (a) an electrically tunable oscillator, said oscillator having a tuning input and an output;
    (b) an integrator coupled to said tuning input;
    (c) a phase detector, said phase detector having a first input coupled to said oscillator output, an output coupled to said integrator, and a second input; and
    (d) a phase shift network coupled between said oscillator output and said second input of said phase detector, said phase shift network including a delay line and phase shift means connected in series with said delay line for providing continuously variable phase shift over a range greater than 360°,
    whereby continuous adjustment of said phase shift means enables continuous tuning of said oscillator over its entire operating range.

2. The system of claim 1 wherein said phase shift means includes means for generating a quadrature signal from an incoming signal supplied to said phase shift means, and resolver means for combining said incoming signal with said quadrature signal to generate an output signal shifted in phase with respect to said incoming signal by a desired amount.

3. The system of claim 2 wherein said resolver means includes first and second varactor-tuned bridge circuits; means for respectively applying said incoming and quadrature signals to said first and second bridge circuits; and means for adjusting said bridge circuits, said adjusting means includes first and second D/A converters having outputs coupled respectively to said first and second bridge circuits and further including input register means coupled to said D/A converters for holding angle data representing the desired amount of phase shift.

4. The system of claim 3 wherein said adjusting means further includes a first ROM interposed between said input register means and said first D/A converter and a second ROM interposed between said input register means and said second D/A converter, said first and second ROMs having stored therein digital values representing the amplitudes of sine and cosine waves, respectively, for a plurality of phase angles from 0° to 360°, and wherein said input register means includes an input register coupled to both of said ROMs.

5. The system of claim 3 wherein said input register means includes first and second input registers coupled directly to said first and second D/A converters, respectively.

6. The system of claim 1 wherein said oscillator is a YIG oscillator.

7. The system of claim 4 wherein said oscillator is a YIG oscillator.

8. The system of claim 5 wherein said oscillator is a YIG oscillator.

9. A method of continuously tuning an oscillator over is entire operating range by control of a variable phase shift network in a feedback loop around the oscillator, said method providing high-resolution, wideband tuning without discontinuities or loss of phase lock, said method comprising the steps;
   (a) detecting the phase difference between an output signal of said oscillator and an output signal of a phase shift network through which said oscillator output signal is passed, said phase shift network including a delay line connected in series with a variable shifter having a range greater than 360°;
   (b) generating a phase-difference signal proportional to said phase difference;
   (c) integrating said phase-difference signal;
   (d) tuning said oscillator with said integrated phase-difference signal; and
   (e) continuously varying the phase shift of said phase shifter over more than 360°.

10. The method of claim 9 wherein said phase-shift varying step is accomplished electronically by generating a quadrature signal from an incoming signal applied to said phase shifter, providing an angle value representing a desired angle of phase shift to said phase shifter, and combining said incoming signal with said quadrature signal in a proportion determined by said angle value.

11. The method of claim 10 wherein said combining step includes deriving the sine and cosine of said angle value, shifting said incoming and quadrature signals in phase by amounts determined respectively by said sine and cosine values, and vectorially adding the shifted incoming and quadrature signals.

12. The method of claim 11 wherein said sine and cosine values are read out of read-only memory from memory locations determined by said angle value.

13. A resolver tuning system, comprising:
   (a) a resolver, said resolver including means for providing variable phase shift over a 360° phase-shift range and control means for controlling the phase shift provided by said resolver, said control means including means for continuously, repetitively varying the phase shift of said resolver over its 360° range;
   (b) a delay line connected in series with said resolver;
   (c) a phase detector, said phase detector having first and second inputs and an output;
   (d) an electrically tunable oscillator, said oscillator having a tuning input and an output, said output being connected to said first phase detector input and being connected to said second phase detector input through said series-connected resolver and delay line; and
   (e) an integrator connected between said phase detector and said oscillator tuning input,
   whereby continuous, repetitive operation of said resolver over its 360° range enables continuous, high-resolution tuning of said oscillator over its entire operating range without discontinuities or loss of phase lock.

14. The resolver tuning system of claim 13 further comprising:
   (f) a phase splitter having means for generating first and second signals shifted in phase relative to each other by 90°, said phase splitter having separate outputs for said first and second signals,
   wherein said resolver includes first and second varactor-tuned bridge circuits, each bridge circuit being connected to one of said phase splitter outputs and having a control input.

15. The resolver tuning system of claim 14 wherein said control means includes an angle data register for holding an angle value representing a desired amount of phase shift; a sine ROM and a cosine ROM connected to said input register, said sine and cosine ROMs having stored therein digital values representing the amplitudes of sine and cosine waves, respectively, for a plurality of phase angles from 0° to 360°; a first D/A converter connected between said sine ROM and the control input of said first bridge circuit; and a second D/A converter connected between said cosine ROM and the control input of said second bridge circuit.

16. The resolver tuning system of claim 14 wherein said control means includes first and second angle data registers for holding first and second angle values together representing a desired amount of phase shift; a first D/A converter connected between said first register and the control input of said first bridge circuit; and a second D/A converter connected between said second register and the control input of said second bridge circuit.

* * * * *

UNITED STATES PATENT AND TRADEMARK OFFICE
CERTIFICATE OF CORRECTION

PATENT NO. : 4,636,747

DATED : January 13, 1987

INVENTOR(S) : Harold N. Selim

It is certified that error appears in the above-identified patent and that said Letters Patent is hereby corrected as shown below:

In column 4, line 14, please change "high-order" to --higher-order--.

In column 5, line 14, please insert --just-- before "described".

In column 6, line 5, please change "Stret" to --Street--.

In column 6, line 15, please change "though" to --through--.

In column 8, line 51, please change "includes" to --including--.

In column 9, line 20, please insert --phase-- before "shifter".

Signed and Sealed this

Twenty-eighth Day of April, 1987

Attest:

DONALD J. QUIGG

Attesting Officer

Commissioner of Patents and Trademarks